US012618878B2

(12) United States Patent
Paulus

(10) Patent No.: US 12,618,878 B2
(45) Date of Patent: May 5, 2026

(54) METHOD AND DETECTOR DEVICE FOR MONITORING CURRENT SENSORS, AND ELECTRIC DRIVE SYSTEM

(71) Applicant: Robert Bosch GmbH, Stuttgart (DE)

(72) Inventor: Sebastian Paulus, Esslingen am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 178 days.

(21) Appl. No.: 18/690,920

(22) PCT Filed: Jul. 25, 2022

(86) PCT No.: PCT/EP2022/070777
§ 371 (c)(1),
(2) Date: Mar. 11, 2024

(87) PCT Pub. No.: WO2023/046334
PCT Pub. Date: Mar. 30, 2023

(65) Prior Publication Data
US 2024/0402223 A1 Dec. 5, 2024

(30) Foreign Application Priority Data
Sep. 27, 2021 (DE) ..................... 10 2021 210 718.4

(51) Int. Cl.
*G01R 19/10* (2006.01)
*G01R 19/00* (2006.01)

(52) U.S. Cl.
CPC ......... *G01R 19/10* (2013.01); *G01R 19/0046* (2013.01)

(58) Field of Classification Search
CPC ................ G01R 19/10; G01R 19/0046; G01R 19/0092; G01R 31/2829; G01R 35/00; G01R 31/343
See application file for complete search history.

(56) References Cited

U.S. PATENT DOCUMENTS

2001/0012984 A1* 8/2001 Adamiak ................. H02H 3/28
702/58

FOREIGN PATENT DOCUMENTS

DE 102004040051 A1 3/2006
DE 102011003566 A1 8/2012
DE 102012211022 A1 * 1/2014 ........ H02M 7/53875
DE 102018251746 A1 7/2020

OTHER PUBLICATIONS

Translation of International Search Report for Application No. PCT/EP2022/070777 dated Nov. 17, 2022 (2 pages).
Harke et al., "The Spatial Effect and Compensation ofCurrent Sensor Differential Gains for Three-Phase Three-Wire Systems", IEEE Transactions on Industry Applications, Jul. 2008, pp. 1181-1189.

* cited by examiner

*Primary Examiner* — Feba Pothen
(74) *Attorney, Agent, or Firm* — Michael Best & Friedrich LLP

(57) ABSTRACT

The invention relates to current sensor diagnostics in an electric drive system. According to the invention, a net current is formed from the sensor values provided by the current sensors. If this net current deviates significantly from zero, a complex current sum can be calculated using the rotor angle of the electric machine. This complex current sum is based on the current RMS current in the electric drive system in order to indicate deviations in the current gain factors of the current sensors used.

7 Claims, 1 Drawing Sheet

METHOD AND DETECTOR DEVICE FOR MONITORING CURRENT SENSORS, AND ELECTRIC DRIVE SYSTEM

BACKGROUND

The present invention relates to a method and a detector device for monitoring current sensors, in particular current sensors for phase currents in a multiphase electrical drive system. The present invention also relates to an electric drive system with such a device for monitoring current sensors.

Electric drive systems are used in numerous areas of application. Electrical energy can be provided by an electrical energy source, such as a battery or similar. The supplied electrical energy can be converted by means of a power converter into a single-phase or multi-phase electrical voltage, which is supplied to the connections of an electrical machine in order to set a predetermined operating state. For example, the electrical currents from the power converter to the phase connections of the electrical machine can be detected to control the electrical drive system and to set predefined setpoint value specifications on the electrical machine. For this purpose, a current sensor can be provided for each phase of the electrical machine, which provides an analog or digital signal corresponding to the electrical current.

The publication DE 10 2011 003 566 A1 describes a method and a device for calibrating a current sensor, in particular a current sensor for detecting a phase current of an electrical machine controlled by an inverter. For this purpose, it is proposed to compare a detected actual value or a variable derived from a detected actual value with a predefined setpoint value and to determine a deviation from a standard state.

SUMMARY

The present invention provides a method and a device for monitoring current sensors and an electric drive system with the features of the independent patent claims. Further advantageous embodiments are the subject matter of the dependent claims.

Accordingly, the following is provided:

A method for monitoring current sensors, in particular for monitoring current sensors for phase currents in a multiphase electrical drive system. The method comprises a step for detecting sensor values for the phase currents. In particular, a current sensor can determine a phase current of the multiphase electric drive system and provide a sensor value corresponding to the determined phase current. The method further comprises a step of calculating a current sum using the detected sensor values from the current sensors. Furthermore, the method comprises a step for determining a real portion and an imaginary portion of a complex current sum. Here, the real portion and the imaginary portion of the complex current sum can be determined using a rotor angle of the electric machine in the electric drive system. Furthermore, the method comprises a step for calculating a complex amplification error of the current sensors. The complex amplification error is calculated from a quotient of the real portion of the complex current sum and a current effective phase current amplitude, as well as a quotient of the imaginary portion of the complex current sum and the current effective phase current amplitude. Finally, the method comprises a step of calculating a magnitude of the complex amplification error.

The following is furthermore provided:

A detector device for monitoring current sensors, in particular for monitoring current sensors for phase currents in a multiphase electrical drive system. The detector device comprises an input interface and a computing unit. The input interface is designed to detect sensor values from current sensors, wherein a current sensor determines a phase current of the multiphase electric drive system and provides a sensor value corresponding to the determined phase current. In particular, sensor values from current sensors can be detected at the phase connections of an electric machine of the electric drive system. Alternatively, it is also possible to detect the phase currents at another point. The computing unit is designed to calculate a current sum using the sensor values detected by the current sensors. Furthermore, the computing unit is designed to calculate a real portion and an imaginary portion of a complex current sum. The real portion and the imaginary portion can be calculated using a rotor angle of the electric machine in the electric drive system. Furthermore, the computing unit is designed to calculate a complex amplification error. The complex amplification error is calculated from a quotient of the real portion of the complex current sum and a current effective phase current amplitude as well as a quotient of the imaginary portion of the complex current sum and the current effective phase current amplitude. Finally, the computing unit is designed to calculate a magnitude of the complex amplification error.

Finally, the following is provided:

An electric drive system with a multiphase electric machine, a plurality of current sensors and a detector device according to the invention. The current sensors are each designed to detect an electrical phase current and output a sensor value corresponding to the detected phase current.

Advantages of the Invention

The present invention is based on the realization that for a current-based control of an electric drive system, high demands are placed on the accuracy and reliability of the current sensors that detect the electric currents in the drive system. For this purpose, the sensor data provided by the current sensors must be inspected and checked for plausibility in order to detect malfunctions such as a gain error (current sensor gain error).

It is therefore an idea of the present invention to take this realization into account and to provide diagnostics of current sensors in an electric drive system which enables reliable and rapid diagnostics of the current sensors even in the case of dynamic processes and asymmetrical resistances in the various phases of the electric drive system.

For this purpose, the measured values of the current sensors for the individual phases of the electrical machine are initially added together to form a current sum. The current sensors can, for example, be provided inside the power converter, at the phase connections of the electrical machine or along the supply lines between the power converter and the electrical machine. The current sensors can output an analog or digital signal that corresponds to the electrical current detected. The signal output by the current sensors can therefore correspond to a value that is proportional to the electrical current in the respective phase line, for example. In this way, the current sensors can each provide a sensor value that corresponds to a phase current of the multiphase electric drive system.

With error-free current sensors and an error-free electrical machine, this current sum is usually zero. However, in the event of an error, for example with different amplification factors in the individual current sensors, the current sum may deviate from zero. In conventional systems, for example, the current sensors can be detected by observing the minima and maxima in the phase currents over a plurality of electrical periods. However, such methods usually only work in a steady state. If, on the other hand, the current varies too much within one electrical revolution, the minima and maxima of the phase currents are different. As a result, no reliable diagnostics are possible for such operating states using conventional methods. In addition, even in the steady state, different electrical resistances in the various phases, for example in the inverter, in the electrical machine or in the supply lines, can result in different values for the minima and maxima.

The present invention therefore provides a method which takes account of the disadvantages of conventional methods mentioned above and also enables reliable diagnostics of the current gain factor of the current sensors under dynamic operating conditions.

For this purpose, the present invention considers the current sum described above, i.e., the sum of all electrical currents in the individual phases of an electrical machine. A complex current sum is formed from this sum using a measured or calculated rotor angle, i.e., the calculated current sum is divided into a real portion and an imaginary portion. The real and imaginary portions of the complex current sum can then be filtered separately if necessary. For example, low-pass filtering, combined low-pass and band-pass filtering or, if necessary, averaging is possible. The current RMS current, which can be obtained from a dq transformation, for example, is filtered with the same filter time constant that is used for filtering the real and imaginary portions of the complex current sum. For the filtering of the current sum, in particular also a separate filtering of the real portion and the imaginary portion, it is preferably necessary to consider the corresponding time curves. Accordingly, the terms "current sum", "real portion" or "imaginary portion" should preferably be understood as the time curve of the corresponding variables.

Furthermore, a complex gain error can be calculated from the complex current sum and the current phase current amplitude. Here, the real portion of the complex gain error results from the quotient of the real portion of the complex current sum and the current phase current amplitude, and the imaginary portion of the complex gain error results from the quotient of the imaginary portion of the complex current sum and the phase current amplitude.

Finally, the magnitude of the complex gain error can be calculated. This amplitude value can be compared with a threshold value, for example, to check whether the gain error is still within a predefined tolerance range or not.

In this way, the current sensor gain of the current sensors for detecting the phase currents can be reliably checked for plausibility even if the phase currents change dynamically.

According to one embodiment, the method comprises a step of comparing the calculated magnitude, i.e., amplitude, of the complex gain error with a predetermined threshold value. Furthermore, the method can comprise a step for detecting a sensor error, wherein a sensor error can be detected if the calculated magnitude of the complex gain error exceeds the predetermined threshold value. The predefined threshold value can be selected so that deviations in the current sensor gain within a predefined tolerance range are accepted, while deviations in the current sensor gain outside the predefined tolerance range are classified as faulty. If a current sensor gain is detected in this way that is outside the acceptable tolerance range, i.e., greater than the predefined threshold value, suitable measures can be taken if necessary. For example, the sensor values of the current sensors can be classified as unreliable in such a case and may no longer be used to control the electric drive system. If necessary, the electric drive system can be switched to emergency operation in such a case or, if necessary, switched off completely. Of course, any other suitable measures are also possible depending on the area of application.

According to one embodiment, the method for monitoring the current sensors comprises a step for filtering the calculated current sum. This can be low-pass filtering, combined low-pass and band-pass filtering or, if necessary, averaging. Accordingly, the real portion of the complex current sum and the imaginary portion of the complex current sum can be calculated using the previously filtered current sum.

According to one embodiment, the method comprises steps for filtering the real portion of the complex current sum and the imaginary portion of the complex current sum. Furthermore, the method comprises steps for determining an effective phase current and for filtering the time curve of the effective phase current. In particular, such filtering filters both the real portion and the imaginary portion of the complex current sum as well as the curve of the effective phase current with the same time constant. Thus, the calculation of the complex gain error can be calculated using the filtered real portion and the filtered imaginary portion of the complex current sum as well as the filtered effective phase current. Here too, filtering can comprise low-pass filtering, combined low-pass and band-pass filtering or averaging.

Alternatively, it is also possible to carry out filtering after calculating the complex phase current amplitudes.

The above embodiments and developments can be arbitrarily combined with one another as far as is reasonable. Further embodiments, developments, and implementations of the invention also comprise combinations not explicitly mentioned of features of the invention described above or below with respect to the exemplary embodiments. The person skilled in the art will in particular also add individual aspects as improvements or additions to the respective basic forms of the invention.

BRIEF DESCRIPTION OF THE DRAWINGS

Further features and advantages of the invention are explained hereinafter with reference to the figures. Shown are.

DETAILED DESCRIPTION

Figure 1:
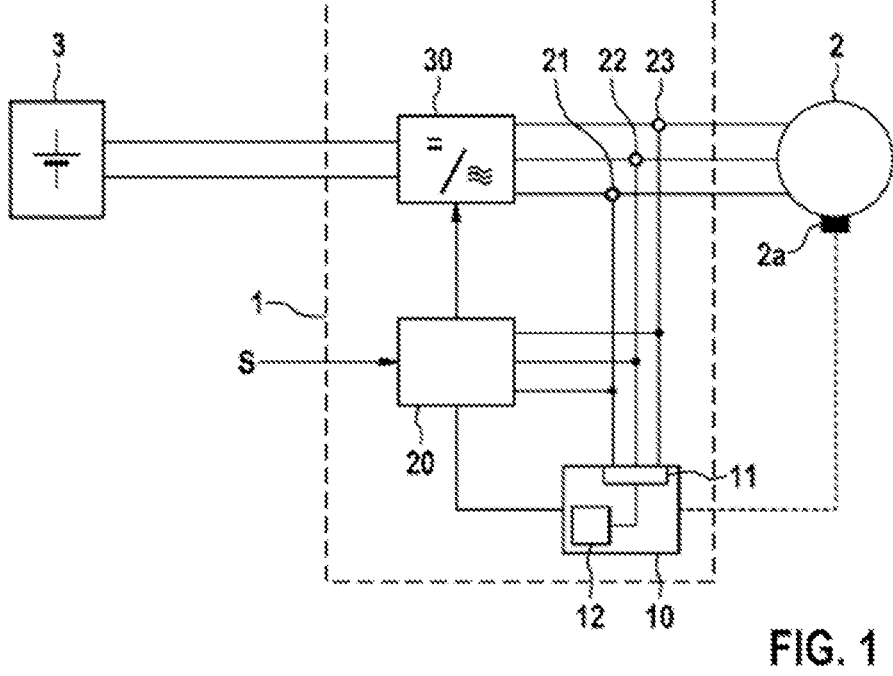
FIG. 1: a schematic representation of an electric drive system with a detector device according to one embodiment.

FIG. 1 shows a schematic representation of a block diagram of an electric drive system according to one embodiment. In the example shown here, the electric drive system comprises an electric energy source 3, for example a DC voltage source, a power converter 1 and an electric machine 2. In the example shown here, the power converter 1 is an inverter that generates a multi-phase AC voltage from the DC voltage provided by the electrical energy source 3 in accordance with a setpoint value specification S and supplies this to the phase connections of the electrical machine 2. Although the example shown here is a three-phase electrical machine 2, the present invention can in principle also be applied to any multiphase electrical machines, which may also have a number of phase connections other than three.

In principle, the present invention can also be applied to any winding arrangements within the electrical machine 2, for example star or delta connections. The only important thing here is that the electrical machine 2 has a winding arrangement in which the entire electrical current flows via the phase connections and no additional current flow is provided, for example via a second star point or similar.

The power converter 1 can, for example, have power electronics with a plurality of switching elements. The switching elements of these power electronics 30 can, for example, be controlled by means of control signals from a control unit 20. In this way, a multiphase AC voltage can be generated from the DC voltage provided by the electrical energy source 3, for example by means of pulse-width modulated control, in order to control the electrical machine 2 based on a setpoint value specification S. The setpoint value specification S can, for example, be a torque to be set or similar.

To control the electrical machine 2 in accordance with the setpoint value specification S, the control unit 20 can detect the electrical currents in the phase lines between the power converter 1 and the electrical machine 2 and adapt the control of the power electronics 3 in accordance with the detected electrical currents and the setpoint value specification S. For this purpose, the electrical currents can be detected by means of corresponding current sensors 21 to 23. The current sensors 21 to 23 can, for example, be provided inside the power converter 1, at the phase connections of the electrical machine 2 or along the supply lines between the power converter 1 and the electrical machine 2. The current sensors 21 to 23 can output an analog or digital signal that corresponds to the electrical current detected in each case. The signal output by the current sensors 21 to 23 can therefore correspond to a value that is proportional to the electrical current in the respective phase line, for example.

For correct control of the electrical drive system, it is necessary that the control is based on correct measured values of the electrical phase currents. For this purpose, the sensor signals output by the current sensors 21 to 23 can be checked and checked for plausibility by means of a detector device 10. A method according to the invention for checking the sensor values of the sensors 21 to 23 is described below.

First, the sensor signals provided by the current sensors 21 to 23 are detected at an input interface 11 of the detector device 10. Since, as already described above, the electrical current between the power converter 1 and the electrical machine 2 flows exclusively via the phase lines, which are monitored by the current sensors 21 to 23, the sum of the currents detected by the sensors 21 to 23 is always zero in an error-free state. The computing unit 12 of the detector device 10 therefore first calculates a net current 1_sum from the sensor values provided by the current sensors 21 to 23 by adding up the real values of the respective phase currents corresponding to the sensor values. This can result in a net current that deviates from zero due to various factors. For example, the individual current sensors 21 to 23 can have different, at least slightly different current sensor gains.

If the net current is zero or below a predefined limit value, this can be interpreted as an indication that the current sensors 21 to 23 are working correctly. Otherwise, i.e., if the net current deviates from zero or exceeds a predefined limit value, the diagnostic scheme described below can be used to diagnose a malfunction in the current sensors 21 to 23, in particular deviating sensor current gains. Alternatively, the diagnostic scheme described below can also be permanently active.

If necessary, the net current 1_sum determined on the basis of the sensor values provided by the current sensors 21 to 23 can be filtered. For example, low-pass filtering, combined low-pass and band-pass filtering or averaging is possible. Such filtering can be used to determine a filtered net current 1_f_sum. If such filtering is applied to the net current, the filtered net current 1_f_sum can also be checked to see whether it deviates from zero or exceeds a predefined limit value.

If the net current 1_sum or the filtered net current 1_f_sum deviates from zero or exceeds the predefined limit value, a complex current sum is first generated from the determined net current 1_sum. This results in the real portion 1_Re and the imaginary portion 1_lm of the complex current sum:

wherein phi represents the rotor angle of the electric machine 2. This rotor angle phi can, for example, be measured using a rotor angle sensor 2a or provided as a calculated value by the control unit 20.

Furthermore, the control unit 20 can also provide a value for the current RMS current 1_eff. This value of the current RMS current 1_eff can be obtained from a dq transformation, for example.

$$1\_Re = (1\_sum - 1\_f\_sum) * \sin(phi) * 2$$

$$1\_lm = (1\_sum - 1\_f\_sum) * \cos(phi) * 2$$

In a further step, the real portion and the imaginary portion of the complex current sum can be filtered. For example, low-pass filtering, combined low-pass and band-pass filtering or averaging can be used. This results in a value for the filtered real portion of 1_Re_f for the filtered complex current sum and a value for the filtered imaginary portion of the complex current sum of 1_lm_f.

Furthermore, the RMS current 1_eff is also filtered with the same filter time constant that was used for filtering the complex current sum. This results in the value 1_eff_f as the filtered RMS current.

From the filtered real portion and imaginary portion of the complex current sum and the filtered RMS current, a complex current gain error can be calculated as follows:

wherein F_err_Re represents the real portion of the complex current gain error and F_err_lm represents the imaginary portion of the complex current gain error.

The amplitude, i.e., the magnitude of the complex current sum, can then be calculated from this complex current gain error as follows:

$$F\_err\_Re = 1\_Re\_f / 1\_eff\_f$$

$$F\_err\_lm = 1\_lm\_f / 1\_eff\_f$$

$$F\_err\_abs = sqrt(F\_err\_Re^2 + F\_err\_lm^2)$$

The magnitude or amplitude calculated in this way can then be compared with a predefined threshold value. If the calculated magnitude or amplitude is below the predefined threshold value, the current gain factors of the current sensors 21 to 23 are within an acceptable tolerance range. However, if the magnitude exceeds the predefined threshold value, this is an indication that the current gain factors of the current sensors 21 to 23 have a deviation outside an acceptable tolerance range. In such a case, appropriate measures can be taken if necessary. For example, the sensor values provided by the current sensors 21 to 23 can no longer be used for controlling the electric drive system, or only to a limited extent. If necessary, the electric drive system can be switched to emergency mode or shut down completely.

In addition to the processes described above, it may also be possible to carry out the filter operations differently from the scheme described above. For example, the filter operations can only be carried out after the complex gain factor has been calculated. Depending on the application, it is also possible to apply filter operations at times other than those described above. The filter operations or the averaging can be applied to either one or more electrical periods of the phase currents in order to generate a filter that makes sense for the corresponding application.

Figure 2:
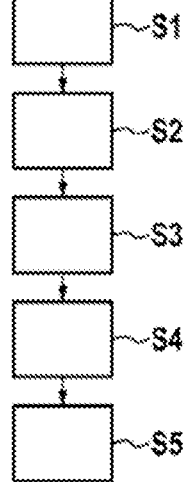
FIG. 2: a flowchart based on a method for monitoring current sensors according to one embodiment.

FIG. 2 shows a schematic representation of a flow diagram on which a method for monitoring current sensors in a multiphase electric drive system is based. The method described below can in principle comprise any of the steps previously described in connection with the diagnostic device 10.

In addition, the diagnostic device 10 described above can of course also have any components required to carry out the method steps described below.

In step S1, sensor values from current sensors for the phase currents of an electrical machine 2 are first detected.

In step S2, a current sum is calculated from the detected sensor values. In step S3, the real portion and the imaginary portion of a complex current sum are determined. As described above, this complex current sum can be calculated using the rotor angle of the electric machine 2 in the drive system.

A complex gain factor is then calculated in step S4. As described above, the calculation is based on the quotient of the real portion of the complex current sum and the current effective phase current as well as the quotient of the imaginary portion of the complex current sum and the current effective phase current.

Finally, in step S5, a magnitude or the amplitude of the complex gain factor is calculated.

The magnitude of the complex gain factor calculated in this way can be compared with a predefined threshold value in order to indicate an impermissible deviation of the current gain factor in one of the current sensors 21 to 23.

In summary, the present invention relates to the diagnostics of current sensors in an electric drive system. According to the invention, a net current is formed from the sensor values provided by the current sensors. If this net current deviates significantly from zero, a complex current sum can be calculated using the rotor angle of the electric machine. This complex current sum is based on the current RMS current in the electric drive system in order to indicate deviations in the current gain factors of the current sensors used.

The invention claimed is:

1. A method for monitoring current sensors (21-23) for phase currents in a multiphase electrical drive system, the method comprising the steps of:

detecting (S1) the sensor values for the phase currents, in each case one current sensor (21-23) determining a phase current of the multiphase electric drive system and providing a sensor value corresponding to the determined phase current;

calculating (S2) a current sum using the detected sensor values from the current sensors (21-23);

determining (S3) a real portion and an imaginary portion of a complex current sum using a rotor angle of the electric machine (2) in the electric drive system;

calculating (S4) a complex gain error from a quotient of the real portion of the complex current sum and a current effective phase current amplitude and a quotient of the imaginary portion of the complex current sum and the current effective phase current amplitude; and calculating (S5) a magnitude of the complex gain error;

comparing the calculated magnitude of complex gain error with a predetermined threshold value; and detecting a sensor error if the calculated magnitude of the complex gain error exceeds the predetermined threshold value.

2. The method according to claim 1, comprising a step of filtering the calculated current sum, wherein the real portion and the imaginary portion of the complex current sum are calculated using the filtered current sum.

3. The method according to claim 1, comprising the steps of:

filtering the real portion and the imaginary portion of the complex current sum, determining an effective phase current, and filtering of a time curve of the effective phase current, wherein the real portion and the imaginary portion of the complex current sum and the time curve of the effective phase current are filtered with the same time constant, and wherein the calculation of a complex gain error is performed using the filtered real portion and the filtered imaginary portion of the complex current sum and the filtered effective phase current.

4. The method according to claim 2, wherein the filtering of the current sum, the real portion and the imaginary portion of the complex current sum and/or the time curve of the effective phase current comprises averaging, low-pass filtering or combined low-pass filtering and band-pass filtering.

5. A detector device (10) for monitoring current sensors for phase currents in a multiphase electrical drive system, the detector comprising:

an input interface (11) which is configured to detect sensor values for phase currents, in each case a current sensor (21-23) determining a phase current of the multiphase electrical drive system and providing a sensor value corresponding to the determined phase current;

a computer (12) configured to calculate a current sum using the detected sensor values from the current sensors (21-23), to determine a real portion and an imaginary portion of a complex current sum using a rotor angle of the electric machine (2) in the electric drive system, to calculate a complex gain error from a quotient of the real portion of the complex current sum and a current effective phase current amplitude and a quotient of the imaginary portion of the complex current sum and the current effective phase current amplitude, to calculate a magnitude of the complex gain error, to compare the calculated magnitude of complex gain error with a predetermined threshold value, and to detect a sensor error if the calculated magnitude of the complex gain error exceeds the predetermined threshold value.

6. An electric drive system comprising:

a multiphase electrical machine (2), a plurality of current sensors (21-23) each configured to detect an electrical phase current and to output a sensor value corresponding to the detected phase current; and a detector device (10) according to claim 5.

7. The method according to claim 1, further comprising switching the electric drive system to emergency operation.

\* \* \* \* \*